United States Patent [19]
Tada

[11] Patent Number: 5,418,799
[45] Date of Patent: May 23, 1995

[54] SEMICONDUCTOR LASER ELEMENT STRUCTURE

[75] Inventor: Hitoshi Tada, Itami, Japan

[73] Assignee: Mitsubishi Denki Kabushiki Kaisha, Tokyo, Japan

[21] Appl. No.: 147,499

[22] Filed: Nov. 5, 1993

[30] Foreign Application Priority Data

Mar. 22, 1993 [JP] Japan .................. 5-061534

[51] Int. Cl.⁶ .............................................. H01S 3/19
[52] U.S. Cl. .................................. 372/44; 372/36; 372/50; 372/109
[58] Field of Search ............. 372/44, 36, 109, 43, 372/50

[56] References Cited

U.S. PATENT DOCUMENTS

| | | | |
|---|---|---|---|
| 4,672,736 | 8/1985 | Westermeier | 29/569 L |
| 4,883,771 | 11/1989 | Kumabe et al. | 437/129 |
| 5,061,974 | 10/1991 | Onodera et al. | 372/50 |

FOREIGN PATENT DOCUMENTS

| | | |
|---|---|---|
| 025690 | 9/1980 | European Pat. Off. |
| 176880 | 9/1985 | European Pat. Off. |
| 341034 | 5/1989 | European Pat. Off. |
| 0139487 | 8/1983 | Japan ............ 372/109 |
| 59-107589 | 6/1984 | Japan |
| 61-64176 | 9/1984 | Japan |
| 368171 | 3/1991 | Japan |

Primary Examiner—James W. Davie
Attorney, Agent, or Firm—Leydig, Voit & Mayer

[57] ABSTRACT

A semiconductor laser device element substrate includes a plurality of semiconductor laser device elements arranged in an array on a semiconductor substrate, the array including a plurality of rows and a plurality of columns, laser resonator facets being located at the boundaries between respective rows of the semiconductor laser device elements, and element separation guiding grooves, for guiding separation of the substrate into a plurality of divided semiconductor laser devices, the grooves being located at the boundaries between the semiconductor laser device elements of the respective columns, wherein the element separation guiding grooves are arranged at positions on different straight lines running in the column direction for each group at least two adjacent rows. Therefore, even if some forces are applied to the substrate, the forces are not concentrated on a point, whereby wafer cracking can be prevented.

10 Claims, 7 Drawing Sheets

( Prior Art )

SEMICONDUCTOR LASER ELEMENT STRUCTURE

FIELD OF THE INVENTION

The present invention relates to a semiconductor laser element substrate and a method for producing a semiconductor laser device, and, more particularly, to a semiconductor laser element substrate that includes element separation guiding grooves and a method for producing a semiconductor laser device using this semiconductor laser element substrate.

BACKGROUND OF THE INVENTION

Figure 7:
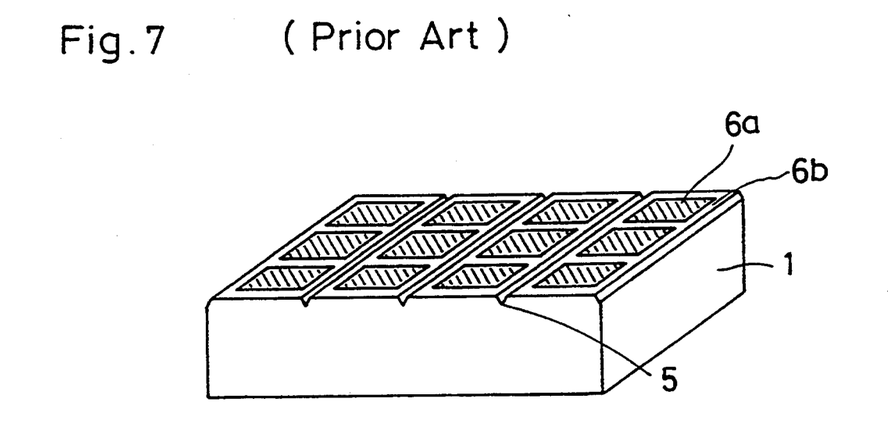
FIG. 7 is a perspective view of the prior art semiconductor laser device element substrate viewed from the bottom surface side.

FIG. 7 is a perspective view of a prior art semiconductor laser having element separation guiding grooves viewed from the bottom surface side, and FIGS. 8(a) to 8(e) are perspective views illustrating process steps in a production method thereof.

In the figures, reference numeral 1 designates a semiconductor laser substrate of about 3 cm×3 cm on which a plurality of semiconductor lasers each having the area of about 300 μm×300 μm are produced in an array comprising a plurality of rows and a plurality of columns on an n-type GaAs substrate that is processed at the front surface. Reference numeral 2 designates a glass plate for adhering to the semiconductor substrate 1. Reference numeral 3 designates wax for adhering the plate. Reference numeral 4 designates a photoresist which becomes an etching mask. Reference numeral 5 designates an element separation guiding groove for separating the plural semiconductor lasers in an array. Reference numeral 6 designates gold plated on a rear surface of each semiconductor laser, which becomes an electrode. Reference numeral 7 designates a blade for separating elements.

A laser resonator in a semiconductor laser is conventionally produced by cleaving facet of a crystal. To realize this, the substrate 1 is made as thin as 100 μm so that cleavage of the crystal is smoothly carried out. After producing the laser resonator by cleaving, the wafer is divided into respective elements. In order to facilitate this element separation, a method of providing element separations guiding grooves on the substrate is often employed.

A description will be given of a flow for producing element separation guiding grooves for semiconductor lasers produced on the n-type GaAs substrate with reference to FIGS. 8(a) to 8(e).

First, the semiconductor laser substrate 1 of which front surface processing has been completed is attached to the glass plate 2 by wax 3 at the front surface of the substrate. A material having almost the same thermal expansion coefficient as the substrate 1 is employed as the glass plate 2, and a material which is melted at around 100° C. is employed as the wax 3. The whole thickness of the substrate 1 is made 100 μm by lapping the rear surface (FIG. 8(a)).

Next, a stripe shaped resist pattern 4 having a width of about 7 μm is formed on the rear surface of the substrate 1 between the elements formed on the front surface of the substrate 1. Successively, the substrate 1 is etched through apertures of the pattern by an etchant such as a bromine-methanol solution and a mixture of tartaric acid and hydrogen peroxide, thereby producing V-shaped element separation guiding grooves 5 each having the depth of about 7 μm (FIG. 8(b)).

Figure 8:
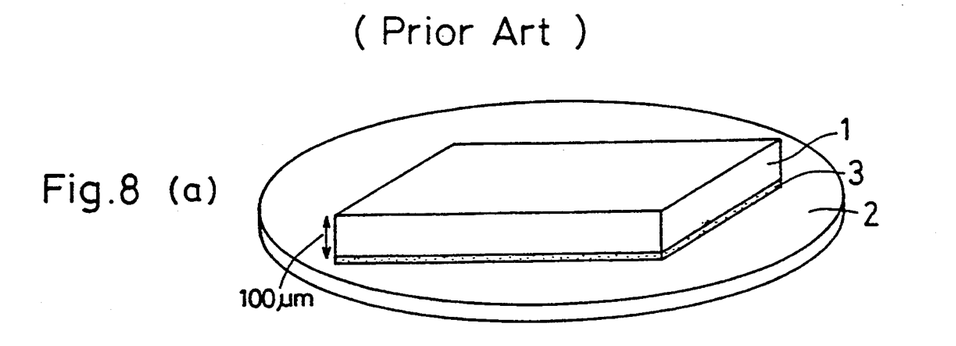
FIGS. 8(a) to 8(e) are perspective views illustrating process steps of a method for producing the prior art semiconductor laser device element substrate.

The element separation guiding grooves 5 are grooves for facilitating the element separation as described above, and in order to surely perform separation along this groove 5, the configuration of the groove is required to be a V-shape having an acute angle. Generally, since an active region is formed along the (011) direction (the direction perpendicular to the (011) surface) in a semiconductor laser, an element separation guiding groove is also produced in the (011) direction. Therefore, it is necessary to form the grooves at the rear surface of the substrate in order to form the V-shaped grooves utilizing the difference in etching rate of various crystal surfaces by a bromine-methanol solution or a mixture of tartaric acid and hydrogen peroxide.

After forming the element separation guiding grooves 5 through the above-described steps, an electrode 6b is formed on the entire rear surface by vapor deposition, and gold 6a is plated for each element, forming electrodes. Thereafter, a heat treatment at about 400° C. is conducted in order to make an ohmic contact of the electrode, and the semiconductor laser substrate 1 and the glass plate 2 are separated by heating and melting the wax 3 (FIG. 8(c)).

Next, in order to form a laser resonator, the laser is attached to a pressure sensitive adhesive sheet and a wafer is cleaved, i.e., a crystal is cleaved by making a flat at an end of the wafer and by dividing the wafer along the crystal surface from the flat, and bars in which the elements are arranged on a line is produced (FIG. 8(d)).

At last, the wafer is separated from the pressure sensitive adhesive sheet, the blade 7 is applied to a portion of the wafer from the side opposite the element separation guiding groove 5 on the rear surface of the wafer, and the wafer is divided into respective elements (FIG. 8(e)).

The production method of the prior art semiconductor laser is constituted as described above, and the element separation guiding grooves are formed on straight lines from one end to an other end of the substrate 1 which has an extremely weak mechanical strength after being lapped to the thickness of 100 μm. Therefore, during the process, for example, when the wafer is held with a tweezer after the substrate 1 is separated from the glass plate 2, the substrate 1 is unfavorably cracked from the element separation guiding groove 5 even when only a little force is applied. Not only does the later process become difficult but also the yield is significantly lowered.

SUMMARY OF THE INVENTION

It is an object of the present invention to provide a semiconductor laser device element substrate that enables element separation similar to that of the prior art as well as suppressing wafer cracking during wafer processing.

It is another object of the present invention to provide a method of producing a semiconductor laser device employing this semiconductor laser device element substrate.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, in a semiconductor laser device element substrate, element separation guiding grooves facilitating the separation of elements are arranged at positions on different lines running in the column direction for each row or for each several rows. Therefore, even if forces are applied from the outside, the forces are not concentrated at a point, whereby wafer cracking hardly occurs.

According to a second aspect of the present invention, in a semiconductor laser device element substrate, gold forming a part of an electrode of a laser element is plated close to the element separation guiding grooves which are arranged at positions on different lines running in the column direction for each of row or for each several rows of elements. Therefore, the plated gold functions as a material for reinforcing the neighboring separation groove portion, whereby wafer cracking hardly occurs.

According to a third aspect of the present invention, a method for producing a semiconductor laser device includes a step of attaching a semiconductor laser element substrate for which front surface processing has been to a glass plate with wax at the front surface of the substrate, a step of lapping the entire element substrate to a required thickness, a step of producing a resist pattern having stripe shaped apertures on the rear surface with shifted positions of the stripe shaped apertures for each row or for each several rows of elements in accordance with element patterns formed on the front surface of the element substrate, and etching portions exposed to the apertures of the resist pattern using the resist pattern as a mask thereby to produce element separation guiding grooves, a step of producing electrodes on the entire rear surface by vapor deposition and then plating gold on respective element positions thereby to produce electrodes for the respective laser device elements, a step of separating the semiconductor laser element substrate and the glass plate, a step of cleaving the substrate to produce resonator facets and producing a bar including plural elements arranged on a row or several rows and, at last, a step of dividing the bar into plural elements by applying a blade to the side opposite the element separation guiding groove of the element substrate, to prevent wafer cracking. Further, since the element separation guiding grooves are shifted for each several rows, the method is applicable to a wafer having a large diameter, resulting in a remarkable increase in the yield.

DETAILED DESCRIPTION OF THE PREFERRED EMBODIMENTS

Embodiment 1, 2

Figure 1:
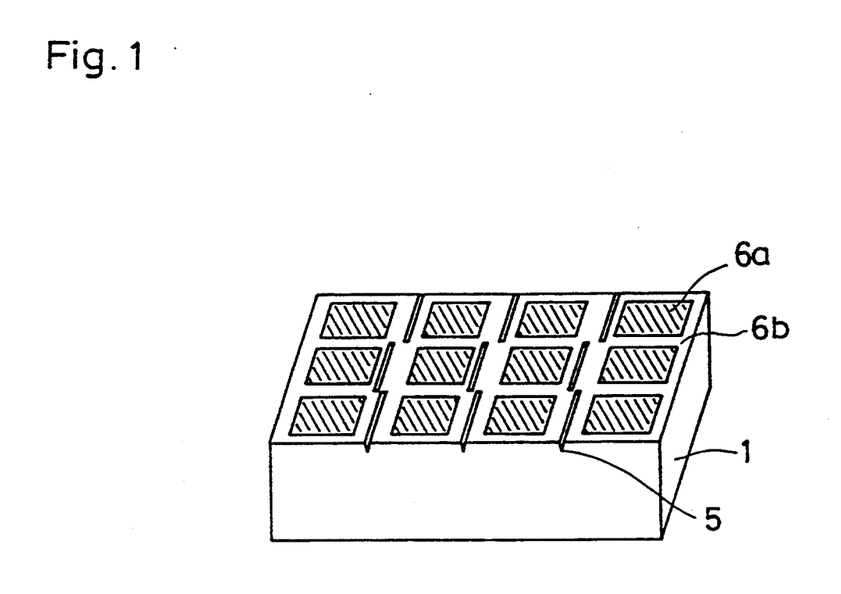
FIG. 1 is a perspective view of a semiconductor laser device element substrate viewed from the bottom surface in accordance with a first embodiment of the present invention.

FIG. 1 is a perspective view of a semiconductor laser device element substrate viewed from the bottom surface in accordance with a first embodiment of the present invention. FIGS. 2(a) to 2(e) are perspective views illustrating a process flow of a method for producing a semiconductor laser device, using the semiconductor laser device element substrate of the first embodiment, in accordance with a second embodiment of the present invention. FIGS. 3(a) to 3(f) are cross sectional views illustrating a structure of the semiconductor laser device element substrate and a process flow for production thereof. In the figures, the same reference numerals as those of the prior art designate the same or corresponding parts.

First, a description will be given of a process flow for a semiconductor laser device after producing the semiconductor laser element structure on a wafer with reference to FIGS. 2(a) to 2(e).

The semiconductor laser device element substrate 1 which has had a production process at the front surface completed is attached to the glass plate 2 with wax 3 on the front surface of the substrate 1. The whole thickness of the substrate 1 is reduced to 100 $\mu$m by lapping the rear surface of the substrate 1 (FIG. 2(a)).

Successively, the stripe-shaped resist pattern 4 having a width of about 7 $\mu$m is formed on the rear surface of the substrate 1 in accordance with an element pattern on the front surface of the substrate 1. At this time, there is a space of about 50 $\mu$m between adjacent elements each having the area of about 300 $\mu$m $\times$ 300 $\mu$m, and positions of the stripe patterns are shifted; i.e., offset, by about 20 $\mu$m for each adjacent element in a column of elements so that the respective patterns are not connected to each other on a straight line. Then, by etching the substrate 1 through apertures of the pattern with an etchant, for example, a mixture of tartaric acid and hydrogen peroxide, the V-shaped element separation guiding grooves 5 each having the depth of about 7 $\mu$m are produced in a state where the grooves 5 in a column are disconnected from each other (FIG. 2(b)).

Then, after forming the electrode 6b on the entire rear surface by vapor deposition, the gold 6a is plated at a position of each element, forming electrodes for respective laser devices. Thereafter, the semiconductor laser substrate 1 and the glass plate 2 are separated (FIG. 2(c)).

Figure 2:
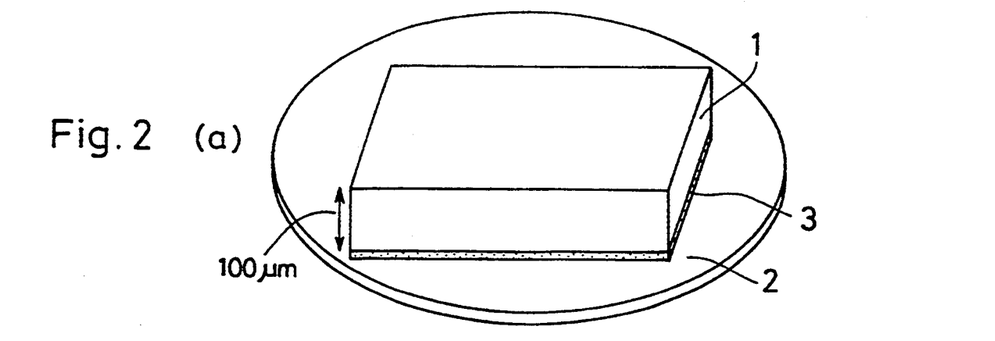
FIGS. 2(a) to 2(e) are perspective views illustrating process steps of a method for producing a semiconductor laser device in accordance with a second embodiment of the present invention.

Next, in order to produce a laser resonator, the crystal is cleaved, producing a bar state where the elements are arranged on a line (FIG. 2(d)).

At last, the blade 7 is applied from the side opposite the element separation guiding groove 5, and the wafer is divided into respective elements (FIG. 2(e)).

Next, a description will be given of a flow for producing the semiconductor laser element structure on the substrate front surface with reference to FIGS. 3(a) to 3(f).

Figure 3:
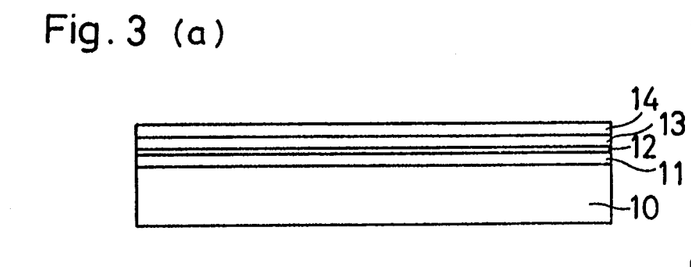
FIGS. 3(a) to 3(f) are cross sectional views illustrating process steps before a semiconductor laser element is produced in the method for producing the semiconductor laser device in accordance with the second embodiment of the present invention.

First of all, there are successively grown on an n-type GaAs substrate 10 by epitaxial crystal growth, for example, MOCVD, an n-type AlGaAs cladding layer 11, an undoped AlGaAs active layer 12, a p-type AlGaAs cladding layer 13, and a p-type GaAs first contact layer 14 (FIG. 3(a)).

After the above-described epitaxial crystal growth, an insulating film 15 such as SiN or $SiO_2$ is produced on the wafer by, for example, sputtering, thermal CVD, or plasma CVD. A photoresist is applied and a stripe shaped pattern is produced by photolithography leaving a portion corresponding to the width W of a ridge 16. Thereafter, the insulating film exposed at each aperture of the photoresist is removed by wet etching employing hydrofluoric acid or dry etching employing $CF_4$, producing the stripe shaped insulating films 15 on the wafer, each having the width W corresponding to the ridge width. Using this insulating film 15 as an etching mask, all the p-type GaAs first contact layer 14 except the ridge part 16 and a part of the p-type AlGaAs cladding layer 13 in the thickness direction, are etched away leaving the cladding layer 13 about 0.2 μm thick (FIG. 3(b)). As an etchant, for example, a mixture of sulfuric acid, hydrogen peroxide and water, a mixture of phosphoric acid, hydrogen peroxide and water, or a mixture of tartaric acid and hydrogen peroxide is employed.

After the above-described etching, an n-type GaAs current blocking layer 17 is produced by the second crystal growth (FIG. 3(c)).

Next, after removing the stripe shaped insulating films 15, the third crystal growth is carried out, forming a p-type GaAs second contact layer 18 (FIG. 3(d)).

Successively, an electrode 19 comprising a metal, for example, gold or titanium, is formed on the p-type GaAs second contact layer 18 by vapor deposition, sputtering and the like, and thereafter gold 20 is plated on the electrode 19 (FIG. 3(e)).

Next, after a photoresist 21 is applied on the front surface as a protecting film, the wax 3 is applied thereon. Thereafter, the substrate front surface where the wax 3 is applied is attached to the glass plate 2 with the front surface toward the glass plate 2 side, and heated above the melting point of the wax 3, fixing the wafer to the glass plate 2. As the wax, a material having the melting point of about 100° C. can be employed.

Next, the rear surface side of the n-type GaAs substrate 10 is lapped to a thickness of about 100 μm. FIG. 3(f) is a cross sectional view showing a state after lapping of the substrate. The perspective view of FIG. 3(f) corresponds to the FIG. 2(a).

In such a semiconductor laser device of this first embodiment, on the semiconductor laser element substrate 1 where a plurality of semiconductor laser elements are formed, the element separation guiding grooves 5 for each row of elements are discontinuous and the positions of the adjacent grooves 5 for each row are offset with respect to each other by about 20 μm. Therefore, even if some forces are applied to the substrate, the forces are not concentrated on a point, whereby the substrate 1 is hardly cracked.

In the production process in accordance with the second embodiment of the present invention, by changing only the mask pattern for producing the photoresist for forming the element separation guiding grooves, production can be carried out utilizing the conventional process as it is. In the element separation step, since element separation is conducted using the blade 7 after cleaving the semiconductor wafer to produce the state, as shown in FIG. 2(d), there arises no problem even when the element separation guiding grooves 5 are shifted for each row. In addition, even when the position of cleavage and the position of the element separation guiding grooves 5 are a little shifted from the design, the wafer is divided into respective elements without problems, because the grooves are located at most of the portions where the element separation guiding grooves are to be positioned.

Embodiment 3

Figure 4:
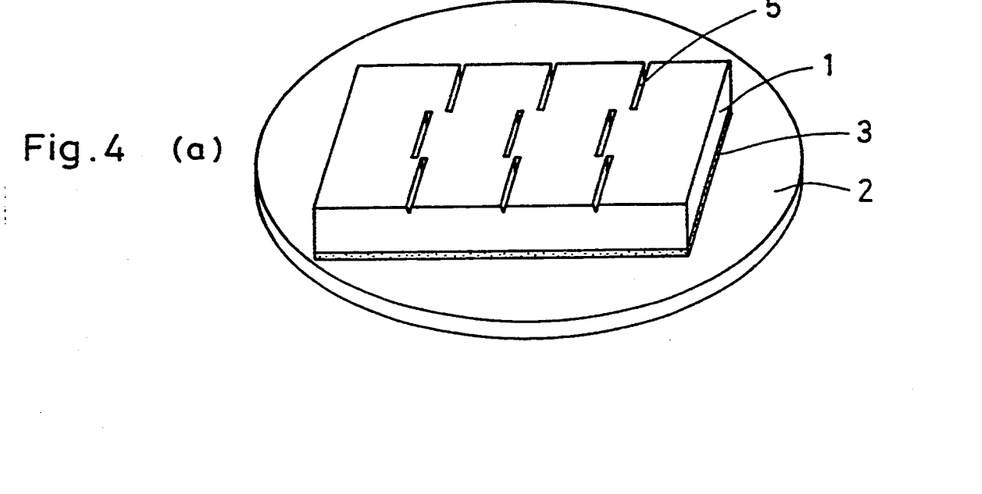
FIGS. 4(a) and 4(b) are perspective views illustrating process steps of a method for producing a semiconductor laser device in accordance with a third embodiment of the present invention.

FIGS. 4(a) and 4(b) show semiconductor laser device element substrates in accordance with a third embodiment of the present invention.

In the figures, the same reference numerals as those of the prior art designate the same or corresponding parts.

FIG. 4(a) shows the semiconductor laser device element substrate up to a state where the element separation guiding grooves 5 are produced by the same process as that of FIGS. 2(a) and 2(b) of the second embodiment.

As illustrated in FIG. 4(a), after producing the element separation guiding grooves 5, the electrode 6b is formed on the entire rear surface by vapor deposition, and thereafter gold 6a (about 5 μm thick) is plated at the position of each element to a position adjacent to (about 10 μm from) the guiding groove 5, producing electrodes for respective laser device elements. Since this plated gold 6a is grown only in an aperture of the photoresist, it is possible to easily deposit the gold 6a just to the side of the guiding groove 5 using the conventional photolithographic process (FIG. 4(b)).

Thereafter, similar to the first embodiment, the substrate 1 and the glass plate 2 are separated, and the process is carried out up to the step of element separation.

According to this third embodiment, similar to the above-described first and second embodiments, since the element separation guiding groove 5 is discontinuous for each row of elements, wafer cracking hardly occurs. Further, since the plated gold 6a is disposed adjacent to the groove 5, the plated gold 6a functions reinforces the element separation guiding groove 5 in the neighboring column, thereby generating wafer cracking less than the first embodiment.

While the positions of the separation guiding grooves 5 are shifted for each row of elements in the first and second embodiments, the positions can be shifted for each several rows (5~10 rows) of elements, whereby the same effects can be obtained.

While the plated gold 6a is employed as the reinforcement material in the second embodiment, other materials, for example, nickel and the like can be used, whereby the same effects can be obtained as a matter of course.

Embodiment 4

Figure 5:
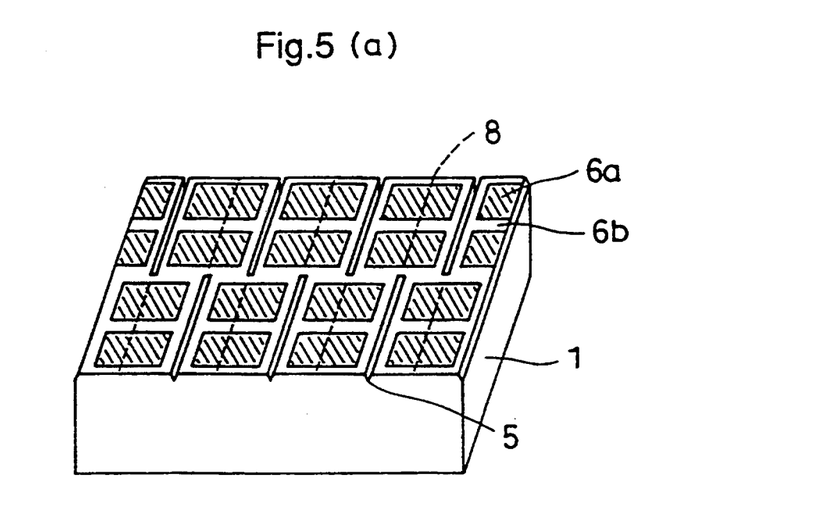
FIGS. 5(a) and 5(b) are perspective views illustrating process steps of a method for producing a semiconductor laser device in accordance with a fourth embodiment of the present invention.

FIGS. 5(a) and 5(b) show semiconductor laser device element substrates in accordance with a fourth embodiment of the present invention. In FIGS. 5(a) and 5(b), the same reference numerals as those of the prior art designate the same or corresponding parts. Here, reference numeral 8 designates an active region of a laser.

In this fourth embodiment illustrated in FIGS. 5(a) and 5(b), active regions 8 of lasers are shifted for each of several rows of elements, whereby the elements are not on lines but are shifted for each of several rows, and accordingly the element separation guiding grooves 5 are disconnected for each several rows and formed at the positions which are shifted each other.

A description will be given of a method for producing the semiconductor laser device in accordance with this fourth embodiment.

In the production method of this fourth embodiment, first of all, the production flow of the semiconductor laser element structure is different from that of the above-described first and second embodiments.

More specifically, in the step of producing the stripe shaped insulating film 15 illustrated in FIG. 3(b), in the production flow of the semiconductor laser element structure of the first and second embodiments, as shown in FIG. 5(b), the stripe shaped insulating film patterns 15 are formed at different positions for each of several rows in regions where the active regions are to be produced. For instance, in a case where the chip size is 300 $\mu$m$\times$300 $\mu$m and the positions of the active regions are shifted for each of the five rows of elements, the stripe shaped insulating films 15 are shifted at an interval of 1500 $\mu$m by an arbitrary width, for example, about 150 $\mu$m. Further, in a case where the chip size is 300 $\mu$m$\times$300 $\mu$m and the positions of the active regions are shifted for each of two rows of elements (FIG. 5(a)), the stripe shaped insulating films 15 are shifted with an interval of 600 $\mu$m by an arbitrary width, for example, about 150 $\mu$m.

Thereafter, similar to the production flow of the semiconductor laser element structure of the first and second embodiments, the same process steps are carried out, for example, using the insulating film 15 as an etching mask, all the p-type GaAs first contact layers 14 except the ridge part 16 and a part of the p-type AlGaAs cladding layer 13 in the thickness direction are etched away leaving the cladding layer 13 about 0.2 $\mu$m thick, producing the semiconductor laser element structure.

Then, after producing this semiconductor laser element structure, similar to the process of the first and second embodiments illustrated in FIGS. 2(a) to 2(e), production of the element separation guiding grooves 5 and production of the rear surface electrodes 6b and 6a are carried out according to the patterns of the element regions formed on the front surface side. More specifically, in a case where the chip size is 300 $\mu$m$\times$300 $\mu$m, the element separation guiding grooves 5 are shifted by 150 $\mu$m, at an interval of 1500 $\mu$m for each five rows or 600 $\mu$m for each of two rows, and the rear surface electrodes 6b and 6a are formed at the positions corresponding to these grooves. Then, element separation is conducted using the element separation guiding grooves 5, producing the semiconductor laser devices.

A wafer 3 cm-square was conventionally employed, but a large wafer of 3 inch$\phi$ or 4 inch$\phi$ has been utilized in recent years. When the wafer diameter is increased, in a case where the wafer is unfavorably cracked during the wafer process, the larger the wafer is, the more elements formed thereon cannot be used. Under these circumstances, in this fourth embodiment, since the alignment of elements in itself is shifted for each of several rows and the element separation guiding grooves 5 are also shifted for each of several rows, the distance of shifting the element separating guiding grooves 5 is about 150 $\mu$m, which can be lengthened relative to about 20 $\mu$m of the first embodiment, thereby occurring less cracking of the wafer. This represents a significant effect in the improvement in the yield. In this case, the complexity of producing the mask patterns in a case where the alignment of elements and the alignment of element separation guiding grooves are shifted for each row can be also solved.

Embodiment 5

Figure 6:
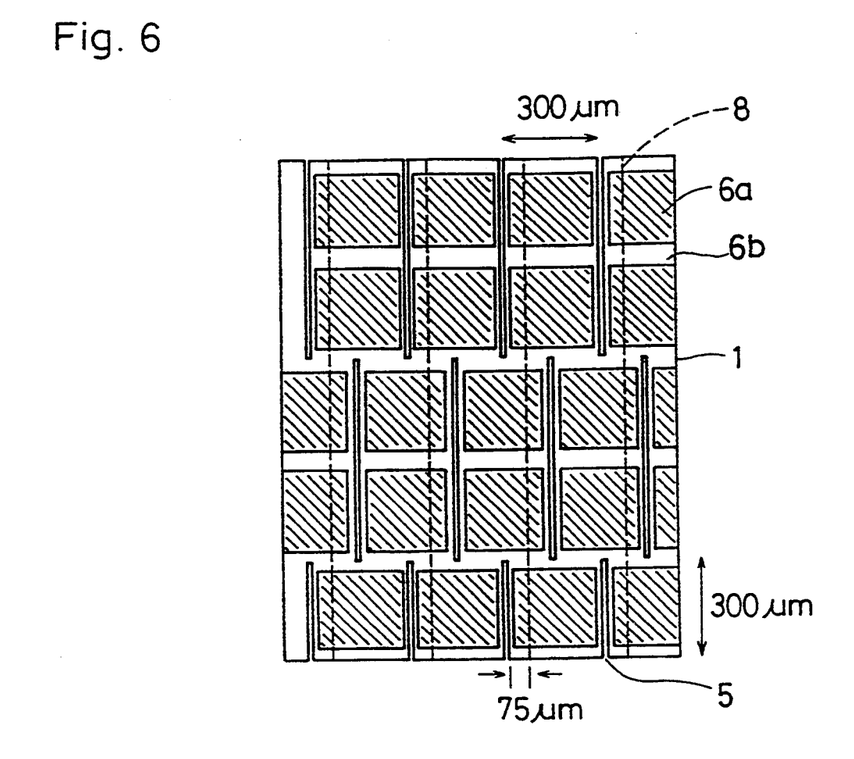
FIG. 6 is a bottom view of a semiconductor laser device element substrate viewed from the bottom surface side in accordance with a fifth embodiment of the present invention.

FIG. 6 shows a semiconductor laser device in accordance with a fifth embodiment of the present invention. In the figure, the same reference numerals as those of the prior art designate the same or corresponding parts.

In the semiconductor laser device element substrate of this fifth embodiment illustrated in FIG. 6, while the active regions on the wafer are positioned on a line for all elements, the positions of the active regions 8 of respective lasers are shifted, toward the right end, the left end, the right end, and the left end for respective elements, by shifting the positions where the respective element regions are produced for each of several rows, for example, in this case, for each of two rows.

A description will be given of a production method of this fifth embodiment.

In the production method of this fifth embodiment, the production flow of a semiconductor laser element structure is the same as that of the above-described first and second embodiments, but a later chip separation process shown in FIGS. 2(b) and 2(c) is different from that of the first and second embodiments.

More specifically, after producing the semiconductor laser element structure according to the production flow of the semiconductor laser element structure of the above-described first and second embodiments shown in FIGS. 3(a) to 3(f), in the process steps for producing the element separation guiding grooves 5 and the rear surface electrodes 6b and 6a shown in FIGS. 2(b) and 2(c), as illustrated in FIG. 6 which is a plan view of the semiconductor laser element substrate 1 (10) viewed from the bottom surface, the element separation guiding grooves 5 are formed so that the active region 8 of each laser is located at a position close to the right end, the left end, the right end and the left end of each element in each element region of 300 $\mu$m$\times$300 $\mu$m, which position is spaced apart from the position of the element separation guiding groove 5 located at the end of the element region by 75 $\mu$m, and the electrodes 6b and 6c are formed corresponding to the elements.

Thus, in this fifth embodiment, by positioning the active region 8 at the end part of each element, the element separation guiding grooves 5 can be shifted so as to have the distance of 150 $\mu$m between the adjacent grooves, which is larger than that of the first embodiment, whereby wafer cracking hardly ever occurs.

Embodiment 6

While in the above-described embodiments a semiconductor laser produced on an n-type GaAs substrate is employed, a semiconductor laser employing other substrates having a similar structure, for example, an InP substrate, can be used.

Embodiment 7

While in the above-described embodiments the element separation guiding grooves are formed on the rear surface side of the substrate, the element separation guiding grooves can be formed on the front surface side of the substrate if V-shaped configuration can be realized.

As described above, according to the present invention, since adjacent element separation guiding grooves facilitating the separation of the elements of the semiconductor laser device are offset for each of several rows of the laser chips, even if some forces are applied to the substrate, the forces are not concentrated on a point, whereby wafer cracking can be prevented.

In addition, according to the present invention, reinforcement of the element separation guiding grooves which are shifted for each of several rows of the laser chips is carried out by plating gold electrodes of the semiconductor laser devices, whereby wafer cracking can be further prevented.

Further, according to the present invention, since the alignment of elements is shifted for each of several rows of the laser chips, the element separation guiding grooves are shifted for each of several rows accordingly, whereby the element separation guiding grooves are discontinuous, thereby preventing wafer cracking, resulting in a remarkable increase in the yield.

What is claimed is:

1. A semiconductor laser element structure comprising a semiconductor substrate including a plurality of semiconductor laser device elements arranged in an array comprising a plurality of rows and a plurality of columns, laser resonator facet planes of the semiconductor laser element structure being located between respective rows of said semiconductor laser device elements, and element separation guiding grooves in said semiconductor substrate for guiding separation of said semiconductor substrate into a plurality of semiconductor laser devices, the element separation grooves being located at boundaries between respective columns, wherein the element separation guiding grooves for each row between adjacent columns are discontinuous and lie on different straight lines parallel to the columns.

2. The semiconductor laser element structure of claim 1 including a plated electrically conductive film on said semiconductor substrate close to the element separation guiding grooves parallel to the columns for each row functioning as part of a device element and reinforcing said semiconductor substrate.

3. The semiconductor laser element structure of claim 1 wherein active regions of said semiconductor laser device elements are located at different positions, offset for adjacent rows.

4. The semiconductor laser element structure of claim 1 wherein active regions of said semiconductor laser device elements are alternating located at right and left ends of the elements in each row.

5. The semiconductor laser element structure of claim 2 wherein said plated conductive film comprises one of gold and nickel.

6. A semiconductor laser element structure comprising a semiconductor substrate including a plurality of semiconductor laser device elements arranged in an array comprising a plurality of rows and a plurality of columns, laser resonator facet planes of the semiconductor laser element structure being located between respective rows of said semiconductor laser device elements, and element separation guiding grooves in said semiconductor substrate for guiding separation of said semiconductor substrate into a plurality of semiconductor laser devices, the element separation grooves being located at boundaries between respective columns, wherein the element separation guiding grooves for each group including at least two adjacent rows between adjacent columns are discontinuous and lie on different straight lines parallel to the columns.

7. The semiconductor laser element structure of claim 6 including a plated electrically conductive film on said semiconductor substrate close to the element separation guiding grooves parallel to the columns for each group of rows.

8. The semiconductor laser element structure of claim 6 wherein active regions of said semiconductor laser device elements are located at different positions, offset for adjacent groups of rows.

9. The semiconductor laser element structure of claim 6, wherein active regions of said semiconductor laser device elements are alternatively located at right and left ends of the elements for each groups of rows.

10. The semiconductor laser element structure of claim 7 wherein said plated conductive film comprises one of gold and nickel.

* * * * *